United States Patent [19]

Takahashi et al.

[11] Patent Number: 5,493,969
[45] Date of Patent: Feb. 27, 1996

[54] SCREEN PRINTING APPARATUS AND SCREEN PRINTING METHOD

[75] Inventors: Ken Takahashi, Nakakoma; Naoichi Chikahisa, Kofu; Takao Naito, Nakakoma; Tetsuya Tanaka, Kofu, all of Japan

[73] Assignee: Matsushita Electric Industrial Co., Ltd., Osaka, Japan

[21] Appl. No.: 374,857

[22] Filed: Jan. 19, 1995

[30] Foreign Application Priority Data

Jan. 20, 1994 [JP] Japan ................... 6-004280

[51] Int. Cl.⁶ .................. B41F 15/00; B41F 15/14
[52] U.S. Cl. .................. 101/126; 101/DIG. 36; 101/129; 33/614
[58] Field of Search .................. 101/126, 114, 101/128.4, 129, DIG. 36; 33/619, 620, 621, 614

[56] References Cited

U.S. PATENT DOCUMENTS 5,176,078  1/1993  Homma et al. ............. 101/126

FOREIGN PATENT DOCUMENTS 0130155  6/1991  Japan ................... 101/126

*Primary Examiner*—Ren Yan
*Assistant Examiner*—Lynn D. Hendrickson
*Attorney, Agent, or Firm*—Wenderoth, Lind & Ponack

[57] ABSTRACT

A screen printing apparatus for printing a printing paste to a to-be-printed object, includes a positioning stage for positioning and fixing the to-be-printed object, a screen printing plate disposed above the positioning stage, a printing squeegee moved in a predetermined moving direction within a horizontal plane while keeping touch with the screen printing plate to thereby print the printing paste on the screen printing plate to the to-be-printed object, a circuit pattern provided on the screen printing plate and inclined at an angle to the moving direction of the printing squeegee, a lift device for relatively moving the positioning stage up and down to a predetermined printing position in a vicinity of a lower face of the screen printing plate, a rotating device for rotating the positioning stage about a longitudinal axis orthogonal to a face of the positioning stage, and a controlling device for controlling and rotating the positioning stage by means of the rotating device so that an inclining angle of the to-be-printed object agrees with the inclining angle of the circuit pattern on the screen printing plate, wherein the printing paste is printed to the object securely positioned on the positioning stage with the use of the screen printing plate having the circuit pattern and the printing squeegee, thereby forming printed circuit portions.

4 Claims, 4 Drawing Sheets

SCREEN PRINTING APPARATUS AND SCREEN PRINTING METHOD

BACKGROUND OF THE INVENTION

The present invention relates to an apparatus and a method for printing a printing paste such as a cream solder or a paste used for formation of thick film circuits to obtain printed circuit boards or the like for the mounting of electronic components.

A screen printing apparatus referred to above has been used, for example, in a printing process when circuits are to be mounted with electronic components. With the recent tendency towards more compact electronic devices, finer and sophisticated circuit boards are required, consequently inviting the need for the cream solder to be printed with high accuracy.

A conventional example of a screen printing method will be described with reference to the drawings.

FIG. 4 is a schematic diagram to explain a conventionally-employed general screen printing apparatus and a method executed by the apparatus. FIG. 5 indicates a state where a printed circuit pattern is attached to a conventional general screen plate.

In the screen printing apparatus in FIG. 4, a printing paste 3 such as a cream solder or the like is supplied onto a screen printing plate 2 where a circuit pattern is formed. A positioning stage 4 for securely positioning an object to be printed such as a circuit board 1 to be printed is moved up and down immediately below the screen printing plate 2. A first printing squeegee 5 which is lowered to the face of the screen printing plate 2 in its right direction's movement for printing and a second printing squeegee 6 which is lowered to the face of the screen printing plate 2 in its left direction's movement for printing are moved up and down above the screen is printing plate 2. When one of the squeegees 5 and 6 is moved down, the squeegee moves in the horizontal direction keeping touch with the screen printing plate 2.

In general, the circuit pattern is arranged in a manner as shown in FIG. 5. That is, the circuit pattern in the longitudinal direction is set approximately in the same direction as the printing direction P by the squeegees 5 and 6, or in a direction approximately orthogonal to the printing direction P. In FIG. 5, 7a is a circuit pattern portion extending approximately in parallel to the printing direction P, and 7b is a circuit pattern portion extending approximately in the orthogonal direction to the printing direction P. Printed circuit portions 8a, 8b of the same configuration (referring to FIGS. 6A–6D) are respectively formed for the circuit pattern portions 7a, 7b by the printing action.

The conventional screen printing method is carried out in the following fashion.

After the to-be-printed object 1 is positioned and fixed by the positioning stage 4, the stage 4 with the object 1 is moved up to immediately below the screen printing plate 2. Thereafter, the first printing squeegee 5 is lowered to print the printing paste 3 to the object 1 while moving in the horizontal direction. Then, the positioning stage 4 is descended, thus completing one printing process. The same process is conducted in the same manner as above by the second squeegee 6. The printing process is repeatedly performed afterwards.

According to the conventional arrangement as above, when the printed portion 8b formed approximately in the orthogonal direction to the printing direction is compared with the printed portion 8a formed approximately along the printing direction, the printing thickness and the printing width are not uniform, that is, the portion 8b is printed irregularly and not accurately. FIGS. 6A–6D show the states of the printed portions by the printing paste, e.g., cream solder, more specifically, FIGS. 6A and 6B indicating the printing states of the printed portion 8a of one lead of an electronic component such as a quad flat pack (QFP) extended approximately in parallel to the printing direction and FIGS. 6C and 6D representing the printing states of the printed portion 8b extended approximately in the orthogonal direction to the printing direction.

SUMMARY OF THE INVENTION

The object of the present invention is therefore to provide an apparatus and a method whereby even a circuit pattern of leads of a QFP or a like electronic component extended in any direction is printed uniformly with the same printing thickness and with the same printing width.

In accomplishing these and other objects, according to a first aspect of the present invention, there is provided a screen printing apparatus for printing a printing paste onto a to-be-printed object, comprising:

a positioning stage for positioning and fixing the to-be-printed object;

a screen printing plate disposed above the positioning stage;

a printing squeegee moved in a predetermined moving direction within a horizontal plane while keeping touch with the screen printing plate to thereby print the printing paste on the screen printing plate to the to-be-printed object;

a circuit pattern provided on the screen printing plate and inclined at angle to the moving direction of the printing squeegee;

a lift device for relatively moving the positioning stage up and down to a predetermined printing position in a vicinity of a lower face of the screen printing plate;

a rotating device for rotating the positioning stage about a longitudinal axis orthogonal to a face of the positioning stage; and a controlling device for controlling and rotating the positioning stage by means of the rotating device so that an angle of the to-be-printed object agrees with the inclining angle of the circuit pattern on the screen printing plate, wherein the printing paste is printed to the object securely positioned on the positioning stage with the use of the screen printing plate having the circuit pattern and the printing squeegee, thereby forming printed circuit portions.

According to a second aspect of the present invention, there is provided a screen printing method for printing a printing paste onto an object positioned and fixed on a positioning stage with the use of both a screen printing plate having a circuit pattern thereon and a printing squeegee, thereby forming printed circuit portions, which comprises the steps of:

providing the screen printing plate with the circuit pattern in a manner to be inclined at an angle to a moving direction of the printing squeegee, positioning the positioning stage by rotating the positioning stage within a horizontal plane so that the to-be-printed object secured to the positioning stage assumes the same inclining angle and the same position as those of the circuit pattern on the screen printing plate, and applying and printing the printing paste.

According to the apparatus and the method of the present invention, the to-be-printed object and the circuit pattern arranged on the screen printing plate can be printed in a manner to be inclined to the printing direction. Therefore, even the circuit pattern of a lead of an electronic component such as a QFP, etc. extended in any direction can be printed uniformly in the same thickness with the same width. Highly accurate printing is hence realized.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
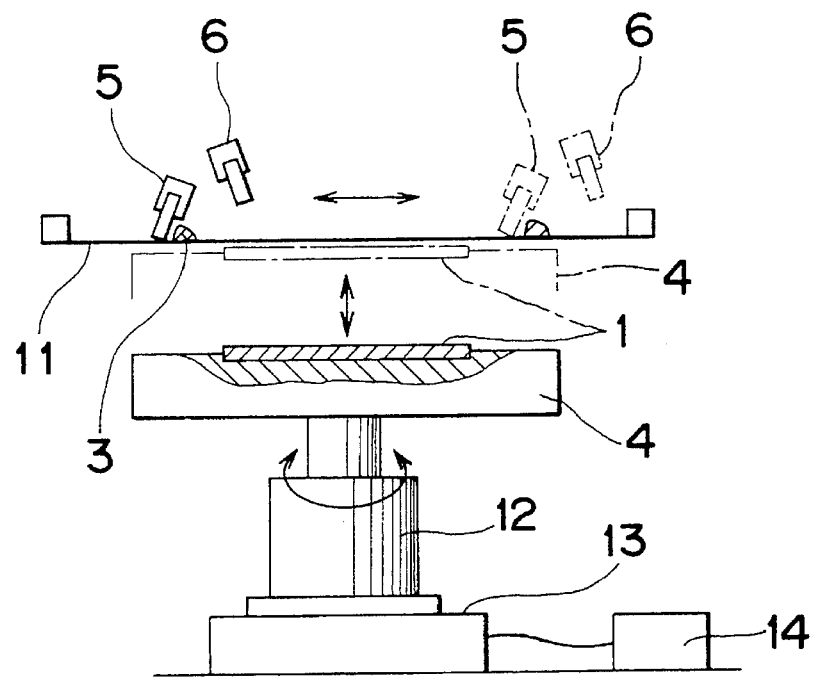
FIG. 1 is a schematic front view of a screen printing apparatus according to one preferred embodiment of the present invention.

Before the description of the present invention proceeds, it is to be noted that like parts are designated by like reference numerals throughout the accompanying drawings.

The present invention will be described hereinbelow taken in conjunction with preferred embodiments thereof with reference to the accompanying drawings in which parts with the same function as in the prior art are designated by the same reference numerals.

Figure 2:
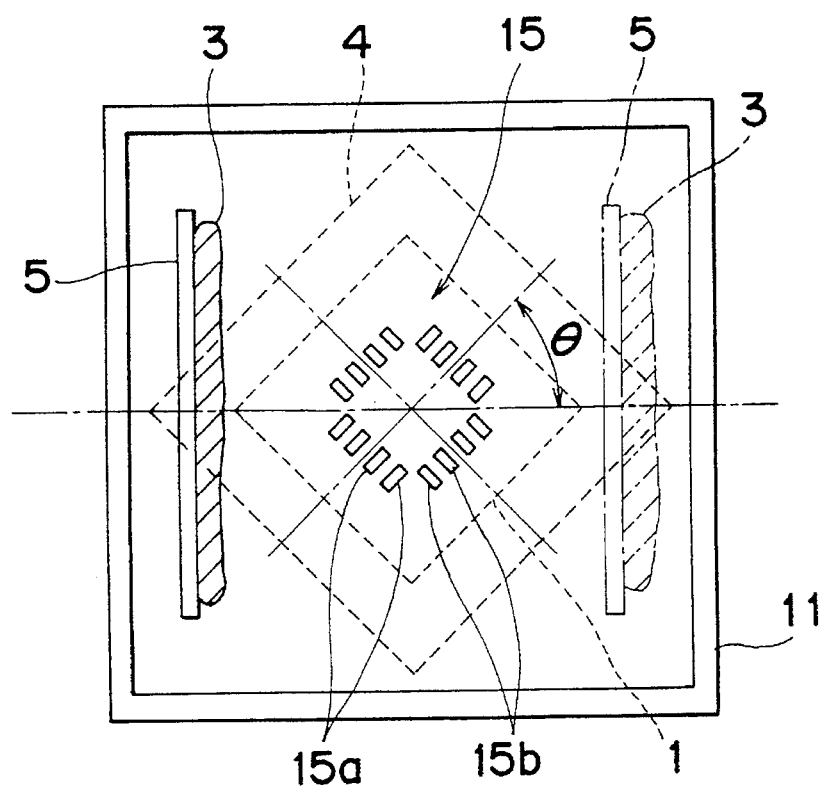
FIG. 2 is a schematic plan view of a screen printing apparatus to explain a screen printing method according to one preferred embodiment of the present invention.
Figure 4:
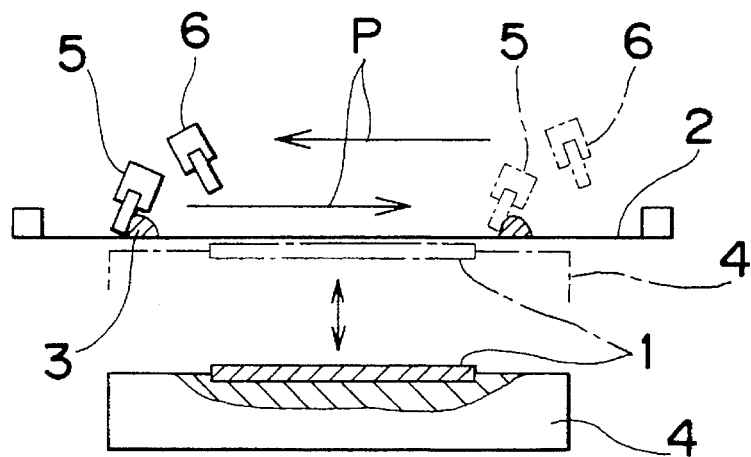
FIG. 4 is a schematic front view of a conventional screen printing apparatus.
Figure 5:
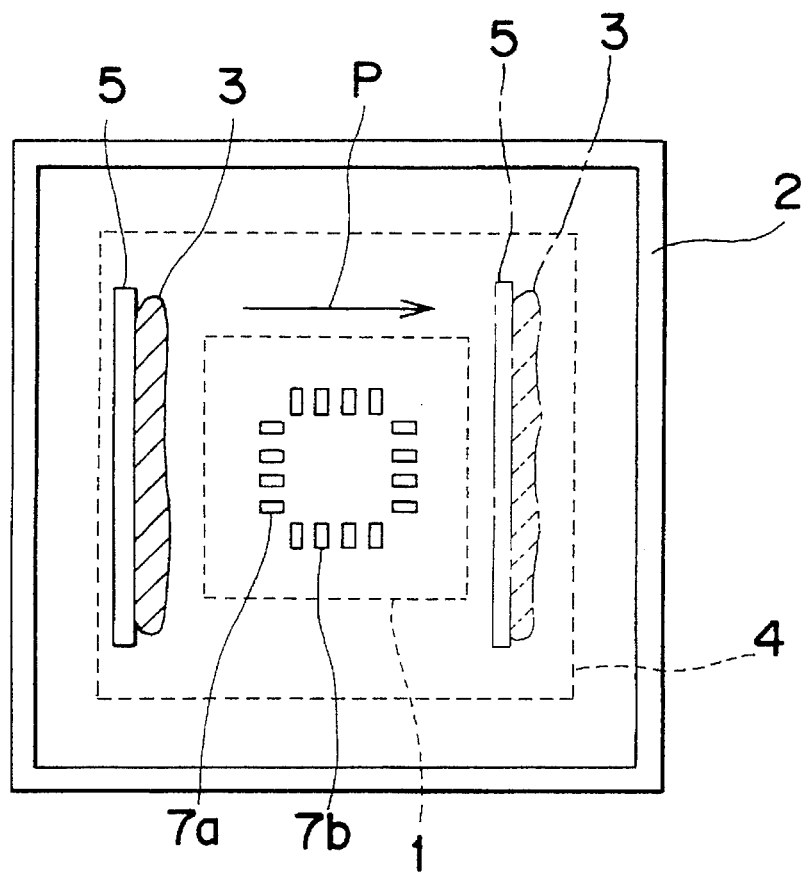
FIG. 5 is a schematic plan view of a screen printing apparatus to explain a conventional printing method.

Referring to FIGS. 1 and 2, a screen printing apparatus of an embodiment of the invention is provided with a positioning stage 4 for fixedly positioning an object such as a circuit board 1, etc. to be printed, a screen printing plate 11 set above the positioning stage 4, printing squeegees 5, 6, a circuit pattern 15 formed on the screen printing plate 11 and inclined an angle θ to the moving direction of the printing squeegees 5, 6, a lift device 12 for relatively vertically moving the positioning stage 4 to a predetermined printing position in the vicinity of the lower face of the screen printing plate 11 as shown by dashed lines and solid lines in FIG. 1, a rotating device 13 for rotating the positioning stage 4 about a longitudinal axis (vertical axis) z orthogonal to the face of the stage 4, and a controlling device 14. The printing squeegees 5, 6 are moved in a predetermined direction within a horizontal plane while keeping touch with the screen printing plate 11 as shown by dashed lines and solid lines in FIGS. 1 and 2, to thereby print the printing paste 3 on the screen printing plate 11 to the object 1. When the positioning stage 4 is rotated by the rotating device 13, the controlling device 14 controls the rotation of the stage 4 with the rotating device 13 so that an inclining angle of the object 1 agrees with the angle θ of the circuit pattern 15 on the screen printing plate 11. Reference numerals 15a, 15b indicate a plurality of printed portions (circuit pattern portions) constituting the circuit pattern 15.

The lift 12 can be constructed by a lifting device for vertically moving the positioning stage 4 to the predetermined printing position in the vicinity of the lower face of the screen printing plate 11 or a lifting device for vertically moving the screen printing plate 11 to the predetermined printing position in the vicinity of the upper face of the positioning stage 4.

In the instant embodiment, the circuit pattern 15 formed on the screen printing plate 11 is inclined the angle θ=45° to the moving direction of the printing squeegees 5, 6. Therefore, both the circuit portions 15a of leads of a QFP or the like extended approximately along the longitudinal direction of the object 1 and the circuit portions 15b extended approximately in the orthogonal direction to the longitudinal direction of the object 1 can be printed with the same angle to the printing direction.

Figure 7:
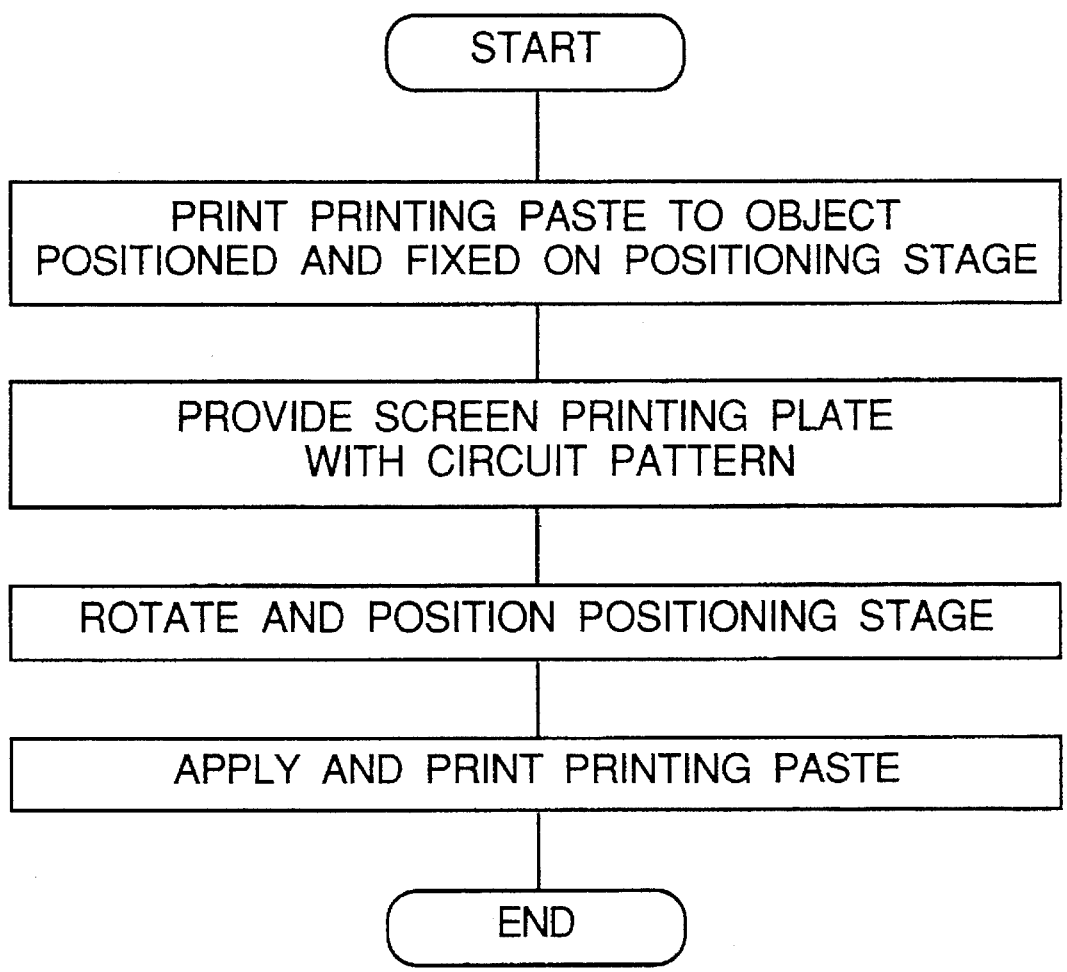
FIG. 7 is a flow chart showing the screen printing method of the embodiment in FIG. 2.

The operation in a screen printing method with the use of the above-discussed screen printing apparatus, according to one embodiment of the present invention will be described below with reference to FIG. 7.

The object 1 positioned and fixed on the positioning stage 4 is moved up to immediately below the screen printing plate 11 by the lift device 12. In the middle way, the positioning stage 4 is rotated the angle θ by the rotating device 13 so as to make a corresponding part of the object 1 agree with the circuit pattern 15 on the screen printing plate 11. Then, printing is started. Although the positioning stage 4 is lowered after printing, it is rotated the angle θ in the opposite direction.

Figure 3A:
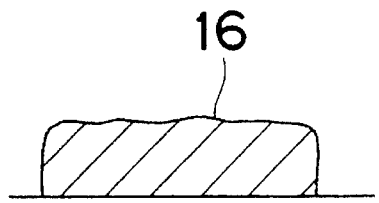
FIGS. 3A and 3B are sectional front and side views of the state of a circuit portion printed in accordance with the screen printing method of the embodiment.
Figure 3B:
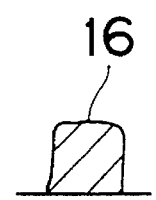
Figure 6A:
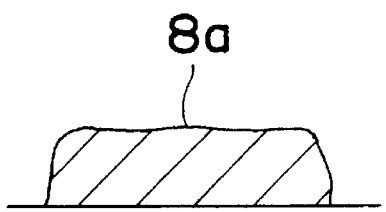
FIGS. 6A, 6B, 6C, and 6D are sectional front, right side, front, and right side views of the state of circuit portions printed by the conventional screen printing method and formed respectively approximately in parallel to the printing direction and approximately in the orthogonal direction to the printing direction.
Figure 6B:
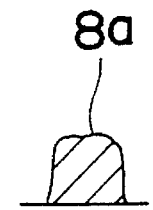
Figure 6C:
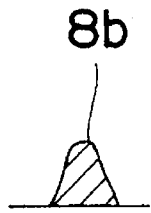
Figure 6D:
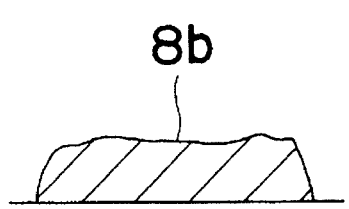

As depicted hereinabove, since the object 1 and the circuit pattern 15 on the screen printing plate 11 are printed with the angle θ inclined to the printing direction, the invention makes it possible to print, even a circuit pattern for leads of a QFP or the like orthogonal to each other, in the same thickness and the same width with high accuracy, as is illustrated in FIGS. 3A and 3B as a printed portion 16.

According to the present invention, the circuit pattern is arranged on the screen printing plate with an inclining angle to the moving direction of the printing squeegees. At the same time, the positioning stage is rotated and inclined by the rotating device within the plane so that the to-be-printed object secured on the positioning stage agrees in angle and in position with the circuit pattern on the screen printing plate. Therefore, the object and the circuit pattern on the screen printing plate can be printed while being inclined to the printing direction. Even a circuit pattern of leads of electronic components such as QFPs or the like extended in any direction can be printed uniformly and accurately in the same thickness and same width.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A screen printing apparatus for printing a printing paste onto a to-be-printed object, comprising:

a positioning stage for positioning and fixing the to-be-printed object;

a screen printing plate disposed above the positioning stage;

a printing squeegee movable in a predetermined moving direction within a horizontal plane while keeping touch with the screen printing plate to print the printing paste onto the to-be-printed object through the screen printing plate;

a circuit pattern provided on the screen printing plate and inclined at an angle to the moving direction of the printing squeegee;

a lift device for relatively moving the positioning stage up and down to a predetermined printing position in a vicinity of a lower face of the screen printing plate;

a rotating device for rotating the positioning stage about a longitudinal axis orthogonal to a face of the positioning stage; and a controlling device for controlling and rotating the positioning stage by means of the rotating device so that an angle of the to-be-printed object agrees with the angle of the circuit pattern on the screen printing plate, wherein the printing paste is printed to the to-be-printed object securely positioned on the positioning stage with the use of the screen printing plate having the circuit pattern and the printing squeegee, thereby forming printed circuit portions.

2. The screen printing apparatus as claimed in claim 1, wherein the to-be-printed object is a quad flat pack, and the angle at which the circuit pattern is inclined to the moving direction of the printing squeegee is 45 degrees.

3. A screen printing method for printing a printing paste onto a to-be-printed object positioned and fixed on a positioning stage with the use of both a screen printing plate having a circuit pattern thereon and a printing squeegee, thereby forming printed circuit portions, which comprises the steps of:

providing the screen printing plate with the circuit pattern in a manner to be inclined at an angle to a moving direction of the printing squeegee, positioning the positioning stage by rotating the positioning stage within a horizontal plane so that the to-be-printed object secured to the positioning stage assumes the same angle and the same position as those of the circuit pattern on the screen printing plate, and applying and printing the printing paste.

4. The screen printing method as claimed in claim 3, wherein the to-be-printed object is a quad flat pack, and the angle at which the circuit pattern is inclined to the moving direction of the printing squeegee is 45 degrees.

* * * * *